United States Patent
Ogawa

[11] Patent Number: 5,331,187
[45] Date of Patent: Jul. 19, 1994

[54] FERROELECTRIC THIN FILM ELEMENT WITH (III) ORIENTATION

[75] Inventor: Toshio Ogawa, Iwata, Japan

[73] Assignee: Myrata Mfg. Co., Ltd., Japan

[21] Appl. No.: 20,555

[22] Filed: Feb. 22, 1993

[30] Foreign Application Priority Data

Feb. 21, 1992 [JP] Japan .................. 4-035243

[51] Int. Cl.⁵ ...................... H01L 29/04; H01L 23/48
[52] U.S. Cl. .................... 257/295; 257/627; 257/771; 257/766; 365/145
[58] Field of Search .............. 257/325, 771, 766, 428, 257/295, 314, 627; 365/145

[56] References Cited

U.S. PATENT DOCUMENTS

| | | | |
|---|---|---|---|
| 3,586,415 | 6/1971 | Kumda | 365/145 X |
| 4,888,630 | 12/1989 | Paterson | 365/145 X |
| 5,088,002 | 2/1992 | Ogawa | 257/771 X |
| 5,189,594 | 2/1993 | Hoshiba | 365/145 X |
| 5,227,855 | 7/1993 | Momose | 257/295 X |

Primary Examiner—William Mintel
Attorney, Agent, or Firm—Ostrolenk, Faber, Gerb & Soffen

[57] ABSTRACT

A ferroelectric thin film element constructed by forming a first electrode composed of an alloy thin film of a Ni-Cr-Al system or Ni-Al system on a substrate and forming a ferroelectric thin film composed of a ferroelectric material having a composition having a spontaneous axis in the direction (111) and having a crystal orientation in the direction (111) on the first electrode composed of a thin film.

7 Claims, 1 Drawing Sheet

FERROELECTRIC THIN FILM ELEMENT WITH (III) ORIENTATION

BACKGROUND OF THE INVENTION

1. Field of the Invention

The present invention relates to a ferroelectric thin film element constructed by forming a ferroelectric thin film on a substrate, for example, to a ferroelectric thin film element suitable for use for a nonvolatile memory, a pyroelectric type infrared sensor and the like.

2. Description of the Prior Art

A ferroelectric thin film element using a ferroelectric material of a lead titanate system is applied to a nonvolatile memory, an infrared sensor and the like utilizing pyroelectric characteristics. This type of ferroelectric thin film element has a structure in which a first electrode is formed on a substrate, a ferroelectric thin film is formed thereon by a thin film forming process such as sputtering, and a second electrode is further formed on the ferroelectric thin film.

Meanwhile, in order to sufficiently exhibit the material characteristics of the ferroelectric thin film, it is necessary to make the crystal orientation of the ferroelectric thin film equal to the direction of a spontaneous polarization axis of the thin film. When the crystal orientation of the ferroelectric thin film is made equal to the direction of the polarization axis of the thin film, it is possible to, for example, reduce the volume change of the thin film in the case of applying alternating pulse cycles to the polarization, thereby to make it possible to prevent the fatigue of the material characteristics.

One example of the above described ferroelectric thin film element is disclosed in Japanese Patent Laid-Open Gazette No. 162369/1987. This document discloses a structure in which a MgO thin film oriented in the direction (100) is formed on a semiconductor substrate, an electrode composed of Pt is formed on the MgO thin film, and a PbTiO$_3$ thin film having a composition of a tetragonal system and having a spontaneous polarization axis in the direction of a c axis, that is, in the direction (001) is oriented in the direction (001) and formed on the electrode composed of Pt. Since the direction of the easy polarization axis of the PbTiO$_3$ thin film is made equal to the crystal orientation thereof, it is possible to take out sufficient ferroelectric characteristics.

Some of ferroelectric materials such as lead titanate (PbTiO$_3$0 and lead titanate zirconate (Pb(Zr$_x$Ti$_{1-x}$)O$_3$) have a composition having a spontaneous polarization axis in the directions other than above described direction (001), that is, the direction of the c axis. For example, in a composition of a rhombohedral phase of lead titanate zirconate, the direction of the polarization axis thereof is the direction (111). If a ferroelectric thin film element can be produced using such a ferroelectric material having a polarization axis in the direction (111), the selection range of materials used for the ferroelectric thin film element can be enlarged. In addition, in a ferroelectric thin film element for a nonvolatile memory, evaluation whether or not the adhesive properties between a ferroelectric thin film and a material composing an electrode are good affects ferroelectric characteristics caused by applying alternating pulse cycles to the polarization.

When an electrode composed of Pt is formed on a MgO thin film oriented in the direction (100), and a thin film composed of a material having a composition of a rhombohedral phase of lead titanate zirconate is formed thereon, it is impossible to obtain an element exhibiting sufficient ferroelectric characteristics as described in the foregoing prior art document. In addition, the adhesive properties between the ferroelectric thin film and the electrode is poor.

SUMMARY OF THE INVENTION

An object of the present invention is to provide a ferroelectric thin film element using a ferroelectric thin film having an easy polarization axis in the direction (111), which is superior in ferroelectric characteristics.

According to the present invention, there is provided a ferroelectric thin film element comprising a substrate, an electrode formed on the substrate and composed of an alloy thin film of a Ni-Cr-Al system or an alloy thin film of a Ni-Al system, and a ferroelectric thin film formed on the electrode and having a crystal orientation in the direction (111), the above described ferroelectric thin film being composed of a ferroelectric material having a polarization axis in the direction (111).

As a composition of the ferroelectric material having a polarization axis in the above described direction (111), it is possible to suitably use a composition of a rhombohedral phase of a ferroelectric material of a lead titanate zirconate system. In addition, thereto, it is also possible to use a composition of a rhombohedral system including Pb(Zn$_\frac{1}{3}$Nb$_\frac{2}{3}$)O$_3$, Pb(Sc$_\frac{1}{2}$Nb$_\frac{1}{2}$)O$_3$ or Pb(Na$_\frac{1}{2}$Bi$_\frac{1}{2}$)O$_3$ or a two-component system composed of PbTiO$_3$ and one selected from Pb(Zn$_\frac{1}{3}$Nb$_\frac{2}{3}$)O$_3$, Pb(Sc$_\frac{1}{2}$Nb$_\frac{1}{2}$)O$_3$ and Pb(Na$_\frac{1}{2}$Bi$_\frac{1}{2}$)O$_3$, a three-component system of titanate zirconate (PZT) and two selected from Pb(Mg$_\frac{1}{2}$NB$_\frac{2}{3}$)O$_3$, Pb(Mn$_\frac{1}{2}$Nb$_\frac{2}{3}$)O$_3$, Pb(Ni$_\frac{1}{2}$Mb$_\frac{1}{2}$) and Pb(Mg$_\frac{1}{2}$W$_\frac{1}{2}$)O$_3$, or the like.

When a functional ceramic thin film is formed on an electrode composed of an alloy thin film of a Ni-Cr-Al system and an alloy thin film of a Ni-Al system, the reactivity of the electrode with the functional ceramic thin film is low, thereby to obtain a stable ceramic electronic component (U.S. Pat. No. 5,088,002). Specifically, examples of an alloy of a Ni-Cr-Al system include one having a composition containing 8 to 25% by weight of chromium and 2.5 to 8% by weight of aluminum, the remainder being composed of nickel and trace elements. In addition, examples of an alloy of a Ni-Al system include one having a composition containing 2.5 to 8% by weight of aluminum, the remainder being composed of nickel and trace elements. The alloy of a Ni-Cr-Al system and the alloy of a Ni-Al system having the compositions are disclosed in the above described U.S. Pat. No. 5,088,002 and the contents thereof are incorporated in the specification.

In the present invention, the above described electrode composed of the alloy thin film of a Ni-Cr-Al system or the alloy thin film of a Ni-Al system is formed on the substrate, and the ferroelectric material having a spontaneous polarization axis in the direction (111) is oriented in the direction (111) and formed thereon to form a ferroelectric thin film. Since the ferroelectric material having a polarization axis in the direction (111) easily orients in the direction (111) on the electrode films with (111) crystal orientation of these alloy materials, the ferroelectric characteristics of the above described ferroelectric thin film are significantly enhanced in the ferroelectric thin film element obtained. In addition, since an aluminum oxide (Al$_2$O$_3$) layer formed on the surface of the electrode as a layer for preventing reaction with PbO is close in coefficient of thermal expansion to the ferroelectric thin film formed thereon, both exhibit significantly good adhesive properties. Furthermore, the presence of this aluminum oxide ($Al_2O_3$) layer easily enhances the formation of a perovskite phase which is a ferroelectric phase.

Consequently, the ferroelectric thin film element according to the present invention using the ferroelectric thin film oriented in the direction (111) can be suitably used for various applications of the ferroelectric thin film element. For example, when the ferroelectric thin film element is applied to a pyroelectric sensor, it is possible to significantly increase the pyroelectric coefficient. When the ferroelectric thin film element is applied to a nonvolatile memory, it is possible to drive the ferroelectric thin film element at a relatively small voltage, for example, an IC driving voltage.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
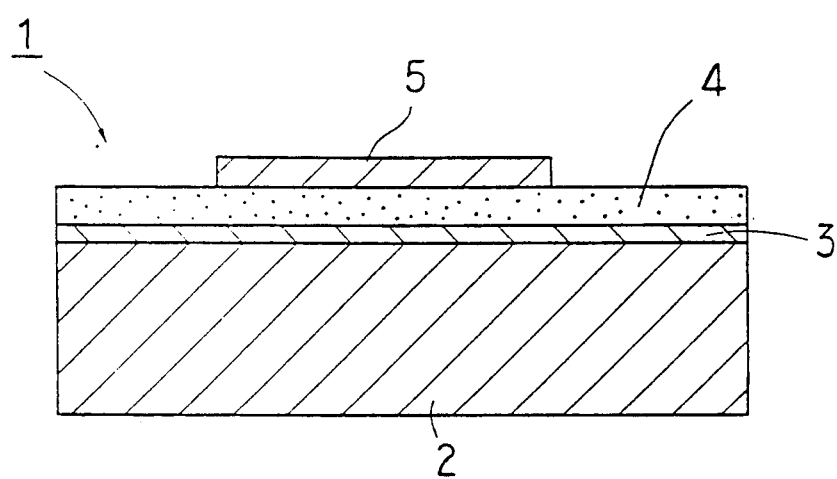
FIG. 1 is a cross sectional view showing a ferroelectric thin film element produced in an example 1.

As one example of the present invention, a ferroelectric thin film element 1 shown in FIG. 1 is produced in the following procedure. In FIG. 1, a ferroelectric thin film element 1 has a structure in which a first electrode composed of a thin film 2, a ferroelectric thin film 4 and a second electrode composed of a thin film 5 are formed on a substrate 2.

As the substrate 2, one composed of a MgO single crystal film in the crystal direction (100) is first prepared. An alloy of a Ni-Cr-Al system containing 74.5% by weight of Ni, 16% by weight of Cr, 4.5% by weight of Al, 3.5% by weight of Fe, and 1.5% by weight of other trace elements such as Y and Mn is sputtered under the following conditions, to form a first electrode composed of a thin film 3 having a thickness of 1.5 μm.

Sputtering conditions at the time of forming electrode composed of thin film (1) Device used . . . RF magnetron sputter device.
(2) Substrate temperature . . . 400° C.
(3) Pressure of gas at the time of sputtering . . . $3.0 \times 10^{-3}$ Torr.
(4) Sputtering gas . . . pure Ar.
(5) RF power . . . 400 W/(per target having a diameter of 2 inches).
(6) Sputtering time . . . several minutes.

Ceramics of a $Pb(Ti_xZr_{1-x})O_3$ system is then used as a target, and is sputtered under the following conditions, to form a ferroelectric thin film of a lead titanate zirconate system 4 having a thickness of 1.5 μm. In the initial stages of this process, the surface of the first electrode composed of a thin film 3 is oxidized.

Sputtering conditions at the time of forming ferroelectric thin film (1) Device used . . . RF magnetron sputter device.
(2) Target used . . . one having a composition of $Pb(Ti_{0.30}Zr_{0.70})O_3$. Lead titanate zirconate having this composition belongs to a rhombohedral phase, and the spontaneous polarization axis thereof is in the direction (111).
(3) Substrate temperature . . . 550° C.
(4) Pressure of sputtering gas . . . 20 m Torr.
(5) Sputtering gas . . . mixed gas containing Ar and $O_2$ in the volume ratio of 90 to 10.
(6) RF power . . . 200 W/(per target having a diameter of 4 inches.
(7) Sputtering time . . . two hours.

Furthermore, the second electrode composed of a thin film 5 is formed on the ferroelectric thin film 4 formed in the above described manner under, for example, the same conditions as the conditions for forming the first electrode composed of a thin film 3 except that the temperature is room temperature so as to evaluate electrical properties, to produce a ferroelectric thin film element in an example 1.

Additionally, a ferroelectric thin film element in an example 2 is produced in the same manner as the example 1 except that an electrode composed of a thin film of a Ni-Al system is formed using a target containing 91% by weight of Ni, 4.5% by weight of Al, and 4.5% by weight of other trace elements such as Fe in place of the electrode composed of the alloy thin film of a Ni-Cr-Al system.

For comparison, a ferroelectric thin film element is produced by forming an electrode composed of a Pt thin film having the same thickness as the above described thickness in accordance with a method disclosed in Japanese Patent Laid-Open Gazette No. 162369/1987 is place of the above described electrode composed of the alloy thin film of a Ni-Cr-Al system and forming a $Pb(Ti_{0.30}Zr_{0.70})O_3$ thin film under the same conditions as those in the above described examples.

With respect to the ferroelectric thin film elements in the examples 1 and 2 and the ferroelectric thin film element in the comparative example using the electrode composed of a Pt thin film which are obtained in the above described manner, measurements are made of the product ratio of a perovskite phase, residual polarization Pr, a coercive field Ec, and the degree of fatigue of the remnant polarization (Pr) caused by reversing the direction of polarization.

As the generation factor of a perovskite phase, the ratio of the strongest lines of pyrochlore and perovskite in an X-ray diffraction analysis, is shown. In addition, measurements are made of the remnant polarization Pr and the coercive field Ec using a Sowyer-Tower circuit so as to observe a D-E hysteresis curve. Further, as the degree of fatigue of the remnant polarization (Pr) caused by applying alternating pulse cycles to polarization, the change ratio (%) in the remnant polarization Pr from the initial value in a case where the thickness of the ferroelectric thin film of a lead titanate zirconate system is taken as 0.5 μm and a pulse of ±40 kV/cm is applied $10^9$ times is shown.

The results of the above described measurements of the product ratio of a perovskite phase, the remnant polarization Pr, the coercive field Ec, and the degree of fatigue caused by applying alternating pulse cycles to polarization are shown in the following table 1.

TABLE 1

|  | Product Ratio of Perovskite Phase (%) | Pr ($C/cm^2$) | Ec (kV/cm) | Degree of Fatigue (%) |
| --- | --- | --- | --- | --- |
| Example 1 | 100 | 30 | 20 | 0 |

TABLE 1-continued

| | Product Ratio of Perovskite Phase (%) | Pr (C/cm$^2$) | Ec (kV/cm) | Degreee of Fatigue (%) |
|---|---|---|---|---|
| Example 2 | 100 | 28 | 30 | 0 |
| Comparative Example | 60 | 7 | 100 | 60 |

As apparent from the table 1, in the ferroelectric thin film elements in the examples 1 and 2, the remnant polarization is significantly larger than that in the ferroelectric thin film element in the comparative example, and the coercive field is significantly smaller than that in the ferroelectric thin film element in the comparative example. Consequently, it is found that a ferroelectric thin film of a lead titanate zirconate system superior in ferroelectric characteristics and oriented in the direction (111) can be formed by using an alloy thin film of a Ni-Cr-Al system or an alloy thin film of a Ni-Al system as the electrode formed as an underlying layer of the ferroelectric thin film.

Although in the above described examples, a substrate composed of a (100) MgO single crystal is used as an underlying substrate on which the alloy thin film of a Ni-Cr-Al system of the alloy thin film of Ni-Al system is formed, it is also possible to use a substrate composed of (100) Si or the substrate composed of (100) Si, the surface of which is subjected to oxidation processing, Si wafer with a MgO single crystal film, and a substrate composed of a sapphire single crystal with R or C surface.

Although the present invention has been described and illustrated in detail, it is clearly understood that the same is by way of illustration and example only and is not to be taken by way of limitation, the spirit and scope of the present invention being limited only by the terms of the appended claims.

What is claimed is:
1. A ferroelectric thin film element comprising:
a substrate;
an electrode formed on said substrate and composed of an alloy thin film in which the alloy is selected from the group consisting of the Ni-Cr-Al system and the Ni-Al system; and
a ferroelectric thin film formed on said electrode and having a crystal orientation in the direction (111), said ferroelectric thin film being composed of a ferroelectric material having a composition with a spontaneous polarization axis in the direction (111).
2. The ferroelectric thin film element according to chain 1, wherein said ferroelectric material has a composition of a rhombohedral phase of ferroelectric ceramics of a lead titanate zirconate system.
3. The ferroelectric thin film element according to claim 1, wherein said ferroelectric material is selected from the group consisting of $Pb(Zn_{\frac{1}{3}}Nb_{\frac{2}{3}})O_3$, $Pb(Sc_{\frac{1}{2}}Nb_{\frac{1}{2}})O_3$, $Pb(Na_{\frac{1}{2}}B_{\frac{1}{2}})O_3$, a two-component system composed of $PbTiO_3$ and one selected from $Pb(Zn_{\frac{1}{3}}Nb_{\frac{2}{3}})O_3$, $Pb(Sc_{\frac{1}{2}}Nb_{\frac{1}{2}})O_3$ and $Pb(Na_{\frac{1}{2}}Bi_{\frac{1}{2}})O_3$, and a three-component system composed of lead titanate zirconate and two selected from $Pb(Mg_{\frac{1}{3}}Nb_{\frac{2}{3}})O_3$, $Pb(Mn_{\frac{1}{3}}Nb_{\frac{2}{3}})O_3$, $Pb(Ni_{\frac{1}{3}}Nb_{\frac{2}{3}})O_3$ and $Pb(Mg_{\frac{1}{2}}W_{\frac{1}{2}})O_3$.
4. The ferroelectric thin film element according to claim 1, wherein said substrate is a substrate composed of a (100) MgO single crystal.
5. The ferroelectric thin film element according to claim 1, wherein said substrate is a substrate composed of a Si wafer with a MgO single crystal film.
6. The ferroelectric thin film element according to claim 1, wherein said electrode is composed of an alloy thin film of a Ni-Cr-Al system.
7. The ferroelectric thin film element according to claim 1, wherein said electrode is composed of an alloy thin film of a Ni-Al system.

* * * * *